(12) United States Patent
Hyman et al.

(10) Patent No.: US 7,355,492 B2
(45) Date of Patent: Apr. 8, 2008

(54) ELECTRONICALLY CONTROLLED HYBRID DIGITAL AND ANALOG PHASE SHIFTER

(75) Inventors: Daniel J. Hyman, Signal Hill, CA (US); Roger T. Kuroda, Poway, CA (US)

(73) Assignee: Xcom Wireless, Signal Hill, CA (US)

( * ) Notice: Subject to any disclaimer, the term of this patent is extended or adjusted under 35 U.S.C. 154(b) by 11 days.

(21) Appl. No.: 11/094,481

(22) Filed: Mar. 31, 2005

(65) Prior Publication Data

US 2005/0270122 A1    Dec. 8, 2005

Related U.S. Application Data

(60) Provisional application No. 60/557,706, filed on Mar. 31, 2004.

(51) Int. Cl.
*H01P 1/18* (2006.01)
*H03H 7/20* (2006.01)

(52) U.S. Cl. ............... 333/164; 333/139; 333/140; 333/161

(58) Field of Classification Search ............ 333/138, 333/139, 140, 156, 161, 164, 24.1
See application file for complete search history.

(56) References Cited

U.S. PATENT DOCUMENTS

| | | | | |
|---|---|---|---|---|
| 3,611,199 A * | 10/1971 | Safran | ............... | 333/109 |
| 4,275,366 A * | 6/1981 | Schwarzmann | ............... | 333/161 |
| 4,682,128 A * | 7/1987 | Sproul et al. | ............... | 333/139 |
| 5,119,050 A * | 6/1992 | Upshur et al. | ............... | 333/164 |
| 5,640,042 A * | 6/1997 | Koscica et al. | ............... | 257/595 |
| 6,281,838 B1 * | 8/2001 | Hong | ............... | 342/371 |
| 6,741,207 B1 * | 5/2004 | Allison et al. | ............... | 342/371 |

FOREIGN PATENT DOCUMENTS

| | | |
|---|---|---|
| EP | 0462338 A1 | 6/1990 |
| JP | 62226708 | 10/1987 |
| WO | WO 02/073798 A2 | 9/2002 |
| WO | WO 02/0737983 | 9/2002 |

OTHER PUBLICATIONS

Kosmin DM et al., "digital-analogue phase shifter on the base of ferroelectric varactors", Microwave and Telecommunication Technology, 2003. Sep. 2003, pp. 471-472, XPO10679637 ISBN: 966-796826X.

Richard W. Burns; "Low Cost Design Techniques for Semiconductor Phase Shifters", IEEE Transactions on Microwave Theory and techniques, vol. 22, No. 6, Jun. 1974, pp. 675-688, XPO02334771, New York, US.

(Continued)

*Primary Examiner*—Robert J. Pascal
*Assistant Examiner*—Kimberly E Glenn
(74) *Attorney, Agent, or Firm*—Smith, Gambrell & Russell, LLP

(57) ABSTRACT

The inventions presented herein provide a electronically controlled phase shifters that incorporate analog and digital phase shift architectures in a novel manner that realizes the best advantages of each architecture. This combination of complementary phase shift architectures provides the high-performance and low loss characteristics of switched digital phase shift architectures with the high resolution and precision of continuous analog phase shift architectures. The circuit embodiments are electronically controlled, which simplifies implementation of what is a complex circuit. The analog phase shift elements comprise electronically-tuned varactors, which provide fine resolution and enables the incorporation of active compensation for manufacturing variation before use or for environmental conditions during use.

26 Claims, 3 Drawing Sheets

OTHER PUBLICATIONS

Kori MH et al. "Switched Reflection Phase Shifter" Electronics Letters, IEE Stevenage, GB, vol. 22, No. 10, May 8, 1986, pp. 550-551, XPO02100293 ISSN: 0013-5194.

Lee S et al, "Low-Loss Analog and Digital Reflection-Type Mems Phase Shifters with 1:3 Bandwidth" IEEE Transactions on Microwave Theory and techniques, IEEE Inc. New York, Us, vol. 52, No. 1, Part 1 Jan. 2004, pp. 211-219, XPO01046330 ISSN: 0018-9480.

* cited by examiner

ELECTRONICALLY CONTROLLED HYBRID DIGITAL AND ANALOG PHASE SHIFTER

CROSS-REFERENCE TO RELATED APPLICATION

This application claims priority from U.S. Provisional Application No. 60/557,706 filed Mar. 31, 2004, the contents of which are incorporated herein by reference.

STATEMENT REGARDING FEDERALLY SPONSORED RESEARCH

This invention has been developed partly under Federal research and development contract DAAH01-02-C-R188, sponsored by the Defense Advanced Research Projects Agency.

BACKGROUND OF THE INVENTION

The inventions described and claimed herein pertain in general to electronic circuits, and more specifically, to phase shifters and phased array antennas. Since the original concept of phased array antennas was postulated, many attempts have been made to develop phase shifters using various technologies and circuit architectures. The presently described inventions comprise novel combinations of previously used individual phase shifter elements and architectures that are able to realize the best features and advantages of each technique.

The following terms used in this patent document have generally accepted meanings in electrical engineering literature and will not be specifically defined herein: resistance, component, circuit, electrons and electronic, capacitor and capacitive, inductor and inductive, control, signal, voltage, current, power, energy, frequency, Hertz, Megahertz (MHz), Gigahertz (GHz), radio-frequency (RF), microwave, millimeter-wave, and all terms of the S.I. and English unit systems.

Other terms have meanings in the context of this document that will be made clear. The description of the drawings and detailed description portions of this document include some of these precise terms that describe numbered elements of the drawings as they occur in the text. For the purposes of this patent document, the following terms are now defined:

Electronically controlled refers to a component, element, or circuit that changes its state or function when an electrical control signal is applied or varied. These signals can include voltage, current, frequency, phase, and other electrical characteristics. An electronically controlled device or element can be either "analog" or "digital".

Digital refers to a component, element, or circuit having separate states that are discretized into an integer number of possibilities.

Analog refers to a component, element, or circuit able to exist in any one possible state out of a continuous range of possible states.

Reactance is an electrical property, which, together with resistance, helps define the circuit performance of a component. Reactance may be either capacitive or inductive. A capacitor component, for example, typically has large capacitive reactance and low resistance.

A varactor is a component that has a variable reactance. An electronically controlled varactor is therefore a component with a capacitance or an inductance value that can be changed by the application or variance of an electrical control signal.

Phase is an electrical property, which, together with amplitude, helps define the state of an electrical signal. Phase is used to describe time in time-varying, cyclical electrical signals.

A phase shift is a change of the phase state for a cyclical electrical signal. Phase shift occurs naturally over time, but it is electronically controlled phase shift is significant with regard to the inventions described.

A circuit element, or element refers to a small electrical circuit comprising one or more electronic components that performs an engineered electrical function.

A phase shift element is a circuit element that causes a phase shift of an electrical signal.

A phase shifter is an electrical circuit comprising one or more phase shift elements, and may also incorporate other engineered electrical functions. Our inventions are directed to various arrangements for phase shifters.

A μm, micron, or micrometer is a unit of length equal to one-one-thousandth of a millimeter Microfabrication is a fabrication method of defining components delineated through photolithographic techniques made popular by the integrated circuit developer community.

Micromachining is the action of delineating a microfabricated element that has been photolithographically defined, often performed by an etching process using acids or bases.

MEMS and MEMS devices are Microfabricated Electro-Mechanical Systems, which denotes a manufacturing technology that uses microfabrication techniques to develop miniaturized mechanical, electromechanical, and thermomechanical components. MEMS devices in this context typically refers to electrical actuators such as switches, relays, and varactors.

Phase shifter circuits and phased array antenna systems employ a variety of technologies and architectures in order to impose phase shifts on load signals. Phase shifters have typically been designed to be individual electronic circuit products that have one input for a load signal, have an arrangement for receiving digital or analog control signals to control the phase shift imposed on the load signal, and have an output for the load signal. In nearly every case, the load signal is an RF, microwave, or millimeter-wave signal that is part of a communications or radar system.

Phased array antenna systems implement phase shifter circuits and other phase shifting techniques in antennas that are used in RF, microwave, and millimeter-wave systems. A phased array antenna system architecture might not employ any phase shifter circuits. However, typically, it would employ tens to tens of thousands of phase shifter circuits. Designers of both phase shifter circuits and phased array antenna systems, therefore, consider phase shift inventions and technologies to be highly relevant to the advancement of radar and communications technologies.

The "phase" of an RF, microwave, or millimeter-wave signal defines the manner in which overlapping signals constructively or destructively interfere with each another. The precise control of load signal phase from a number of separate antennas enables the radiated signal to be electrically aimed in varying directions without having to physically aim the antenna. This ability to aim provides numerous functional advantages including but not limited to power consumption, size, speed, and functionality to radar and communications systems that employ phased array antennas. Because of the technical advantages of phased array antennas, improving phase shifter circuit designs and phased array antenna concepts has been the subject of industry research for many years.

A typical phase shifter circuit imposes a phase shift upon a load signal when a control signal is applied to the phase shifter. The amount of phase shift provided depends upon the control signal and upon the complexity and architecture of the phase shifter. The phase shift imposed typically varies between 0 (zero) and 360 degrees for communications systems, where the zero phase shift will be relative to some baseline phase shift. For an input phase at zero degrees, one phase shifter circuit might have baseline phase shift of 63 degrees at a particular frequency, and might therefore provide an output that has a phase shift of between 63 degrees and 423 degrees (360+63=423). Radar systems often have much greater phase shift requirements, so phase shifter circuits designed for these systems might provide between 0 and many thousands of degrees.

The majority of phase shift technologies and architectures do not provide a constant phase shift as a function of frequency. A desired phase shift may only be available for a limited frequency range, and operation outside of that frequency range will not generate a desired phase shift. Many phase shift technologies and architectures provide a phase shift that is linearly related to frequency; such a phase shifter circuit might provide 180 degrees of maximum phase shift at 12 GHz and only 90 degrees of maximum phase shift at 6 GHz.

There are many classification techniques that can be attributed to the variety of phase shift technologies and architectures in use by the phase shift circuit design and phased array antenna system fields. Within the context of this patent document, all of these technologies and architectures are considered in terms of the precision with which a desired phase shift can be imposed upon a load signal. There are two categories of technologies; those that provide a finite number of discrete phase shift options, and those that provide an infinite or continuous number of phase shift options. Finite-option phase shift technologies and circuit architectures are referred to as "digital" phase shift techniques, and infinite-option phase shift technologies and circuit architectures are referred to as "analog". These definitions for the terms digital and analog with respect to defining inherent properties of technologies and architectures remain valid regardless of the type of electrical control signals used to control those digital and analog technologies and architectures. For example, an analog technology or architecture is always considered to maintain analog characteristics and definition in context of this patent document, even if that technology or architecture in a particular embodiment of this invention were to be controlled electrically by a "digitally-generated" analog voltage variance of a control signal.

Digital phase shift techniques have a discrete number of possible phase shift states, such that only a finite number of phase shift options are available for use. In a similar fashion as the computer industry, these phase shift states are often referred to in terms of the number of options, stated to the second power in terms of bits. A "three-bit phase shifter" would therefore be a digitally-controlled phase shifter circuit with a total of eight possible states ($2^3=8$). A "five-bit phase shifter" would have 32 possible states, and so forth. The values of these states are usually within a range of zero (relative to baseline, which could be any value) to a predetermined maximum phase shift. A 360 degree three-bit phase shifter, for example, would have the following degree phase shift options: 0, 45, 90, 135, 180, 215, 260, and 305 degrees.

In the context of many systems, 360 degrees and 0 degrees are electrically equivalent, so the phase shifter would not require a full 360 degree phase shift.

Analog phase shift techniques have a continuous range of phase shift possibilities that can be imposed upon the load signal. The ability to impose precise values provides analog phase shift techniques important advantages over digital phase shift techniques. Continuous values of phase shift, rather than discrete values, provides a system designer with a greater range of options for implementing the phase shifter circuit, which means that antennas can be aimed more accurately, or the phase shifters themselves can compensate for manufacturing or environmental phase shift error. Analog phase shift technologies tend to have a limited range of applied phase shift, however, so multiple phase shift elements might be connected in series in order to obtain a phase shift range up to 360 degrees or more.

Analog phase shift technologies and architectures generally have a high signal loss characteristic, which means that the load signal can have a continuous, precise phase shift, but the majority of the load signal strength will be dissipated within the phase shifter circuit. In electrical engineering terms, the loss figure of phase shift technologies and circuit architectures is given in terms of decibels (dB), where a packaged 360 degree analog phase shifter might have between 6 and 12 dB of loss (losing ¾ to ¹⁵⁄₁₆ of the signal power) at microwave frequencies. Digital architectures, on the other hand, might have 1.5 to 3 dB of loss per bit of phase shift precision at microwave frequencies.

In the fields of phase shifter circuit design and phased array antenna systems, there are many devices which incorporate different digital or analog phase shift architectures and technologies. Digital phase shift architectures are used to provide a large phase shift at a low circuit loss, and often have high linearity and other desirable electronic circuit performance qualities. As digital phase shifter designs increase in precision and resolution, however, they suffer high loss and complexity. Analog phase shift architectures and technologies are used to provide fine resolution and continuous tuning of circuits, but all known analog phase shift technologies and architectures suffer from very high loss.

Digital phase shift technologies have been developed which include a wide variety of semiconductor phase shifter products based on gallium-arsenide substrates and other traditional high-frequency integrated circuit technologies. Research is being carried out with respect to micromachining and MEMS technologies in an effort to develop digital phase shifter circuit architectures based on MEMS devices. One line of investigation is pursuing traditional architectures using MEMS devices (see U.S. Pat. No. 6,653,985), or employ MEMS devices in novel architectures within the phase shift circuits and antennas themselves (see Sikina—Published U.S. Patent Application 2003/0184476 A1 and Huff—Published U.S. Patent Application 2003,0020173 A1). The arrangements described in these publications have the same inflexibility shared by all digital phase shift circuit technologies.

Because of their tunability and precision advantages, analog phase shift technologies have been an active area of research and development by the industry. Developments range from using traditional semiconductor technologies (see U.S. Pat. No. 4,837,532), which have become commercial products over the years, to the use of modern materials as varactors for higher performance phase shifter circuit designs, which is the focus of Babbitt—U.S. Pat. No. 5,334,958, Osadchy—U.S. Pat. No. 6,621,377, and others—

U.S. Pat. No. 6,538,603. Efforts continue in industry, government, and academia to create higher-performance, lower-loss analog phase shift circuitry.

One line of research has recognized some advantages of combining digital phase shift technologies with analog phase shift technologies in order to achieve both low loss and continuous tunability. Sayyah (U.S. Pat. No. 6,509,812) has designed an optical-electrical hybrid phase shifter, which uses MEMS devices for a low-loss digital (referred to as "coarse") phase shift element in a first stage and an optically-controlled variable resistor for a continuously-tunable analog (referred to as "fine") phase shift element in a second stage.

Despite the demonstrated long-felt need and the active and wide-ranging efforts by numerous researchers and groups including those above, none of the resulting devices embody the fundamental conflicting desired attributes of low loss and fine tunability of phase shifting in high-performance radar and communication systems.

SUMMARY OF THE INVENTION

Our inventions provide novel phase shifter architectures providing a much more useable circuit solution than any of those of the prior art by employing technologies having electrical control techniques and variable reactor technologies instead of the optically-controlled variable resistor technologies, such as shown in the Sayyah reference discussed above. Our novel architectures use many high-performance varactor materials being developed by the industry, such as ferroelectric and paraelectric materials, which can provide further advantages in terms of control and tuning. The inventions described herein take advantage of the nature of electrical controls by correcting for phase error from manufacturing, operating conditions, and/or device degradation. Our architectures are fully-scalable to achieve greater or lesser quantities of phase shift from either the digital or analog phase shift elements, so that phase shifter circuits can be developed for many applications with a wide tuning range.

The inventions described herein are the first devices to attain a highly precise and tunable phase shift having a compact size, low loss, and high quality of electrical performance with minimal limitations in implementation. They solve long-standing problems of the phase shifter industry by providing devices that perform large phase shifts digitally with low loss, and then perform small phase shifts with electronically controlled analog phase shift circuitry.

The inventions are directed to a new type of electronically controlled phase shifter that incorporates modern analog and digital phase shift circuit architectures in a novel manner that realizes the best advantages of each. This combination of complementary circuit architectures provides the high-performance and low loss characteristics of switched digital phase shift elements with the high resolution and tuning capabilities of continuous analog phase shift elements. The circuit arrangements provided herein are electronically controlled, which simplifies implementation of this complex architecture. The analog phase shift elements include electronically-tuned varactors, which provide high resolution and enable the incorporation of active compensation for manufacturing variation before use or for environmental conditions during use. The inventors are not aware of any work previously carried out on such a hybrid combination of architectures and technologies.

BRIEF DESCRIPTION OF THE DRAWINGS

The figures are plan views of phase shifter circuits and elements illustrated as circuit schematics. These schematics are representative of the physical layout of these circuits using planar manufacturing techniques. Objects are defined using cross-hatching, succinct black borders, and numeration. All objects shown in white or light cross-hatching represent components that are typically manufactured of electrically insulating materials. Objects shown in dark cross-hatched patterns represent components and transmission lines that are typically electrical conductors, or represent more complex circuit elements common to the industry.

FIG. 1B shows a circuit that employs a varactor as the phase shift tuning component. FIGS. 1C, 1D, 1E, and 1F each employ switchable components as the phase shift tuning components.

DETAILED DESCRIPTION

Figure 1A:
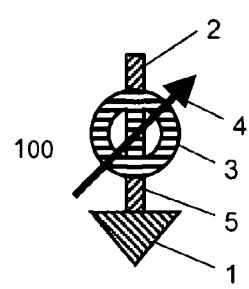
FIG. 1A is a functional circuit symbol used in the remainder of the drawings to represent a phase shift load that imposes a phase shift on an electrical signal that is exposed to the input of the circuit. This symbol represents a variety of circuit elements that can perform this electrical loading function, and is used in FIGS. 2A, 2B, 2C, 3A, 3B, and 3C in the interest of brevity and clarity.

The inventions described herein are directed to a new type of electronically controlled phase shifter circuit that incorporates phase shift elements using a hybrid arrangement of both analog and digital phase shift circuit technologies and architectures. This combination of complementary phase shift elements provides the high-performance and low loss characteristics of digital phase shift elements with the fine resolution and precision of analog phase shift elements. A discriminating advantage over prior art is the use of electronically controlled analog phase shift elements using electronically-tuned varactors. These components provide high resolution for analog phase shift elements, and enable the use of active compensation for phase error induced in manufacture or in use. The following description first discusses this functional combination of actuator technologies, then continues with a detailed discussion of several of the contemplated embodiments of this invention.

A phase shifter circuit element imposes a phase shift on an electrical load signal. The phase shift can be due to load signal propagation velocity change (slowing the signal), a physical change in the path length taken by the load signal, a change in the electrical characteristics of a transmission line on which the load signal propagates, or by other means. The manner by which a phase shift is induced may or may not be important to the operation of a system which employs a phase shifter circuit, so this must be considered carefully by designers. Typically phase shift circuitry is employed in various applications in which load signals are cyclical, such as occurs at RF, microwave, and millimeter-wave frequencies.

Phase shifters are circuits that enable the design and development of larger electronic systems, including phased array antennas and electronically steerable antenna apertures (ESAs). ESAs are able to reshape and/or redirect antenna radiation beams of RF, microwave, or millimeter-wave electromagnetic energy. These emissions carry radar and communications signals, and the ability to steer antennas without physical motion provides speed, power, and reliability advantages to aerospace, military, and civilian applications which must send and receive information quickly and efficiently. High-performance phase shifter circuits, therefore, are valuable for RF, microwave, and millimeter-wave systems. The research effort put into new technologies to create analog ferroelectric and digital MEMS versions of phase shifter circuits attest to the strong interest and activity held by the radar and communications industry.

Digital phase shifters and digital phase shift elements are circuits that impose one out of a limited, discrete number of phase shift options upon the load signal. The use of the descriptor "digital" refers to a common use of the computer industry term "bits" to define the number of states capable of the phase shift element, with exact details provided in the background section of this document. In the context of these documents, it is contemplated that digital is used to refer to any phase shift technology or circuit architecture that has a finite number of states, regardless of the specific implementation of the control circuit design. The advantage of digital phase shift technologies and architectures is that they tend to have electric control access, and tend to have low loss and other desirable electrical characteristics. The disadvantage of digital phase shift technologies and architectures is that they are limited the discrete phase shift options, and cannot perform small tuning or compensation for phase error.

Analog phase shifters and analog phase shift elements are circuits that impose a value of phase shift that is selected out of a continuum of possible options. The use of the descriptor "analog" refers to the common electronics industry usage in describing electrical components and circuits that operate over a continuum of states. In the context of these patent documents, it is contemplated that analog refers to any phase shift technology or architecture that offers a continuum of phase shift options. The advantage of analog phase shift technologies and architectures is that they typically have precise control of phase shift within their operating range, and small variations in phase shift can be imposed in order to tune to desired values, or to compensate for phase shift errors that may be present due to operating conditions or circuit degradation. The disadvantage of analog phase shift technologies and architectures is that they typically have large power loss and other poor electrical performance characteristics.

The inventions described herein are phase shifter circuits which incorporate at least one digital phase shift element and at least one analog phase shift element. These elements are combined into a circuits that have low loss and high performance of digital phase shift technologies and architectures, and use the analog phase shift element or elements to perform precise tuning of desired phase shift states. The inventions include electrically controlled digital and analog phase shift technologies and architectures, where these analog technologies and architectures employ varactors as analog components. These considerations are contemplated regardless of whether the analog phase shift elements are controlled with analog electrical control signals or with digital electrical control signals. Thus, it is possible to use digital control electronics with a D/A converter to drive the analog technologies in the phase shifter. As used in this patent document, "analog" and "digital" components are so defined because of their technology rather than the driver circuit used to control them.

The inventions described herein are phase shifter circuits having a range of capabilities for handling load signal power, frequency, and bandwidth. The range of load signal power handling is contemplated to vary between common transmit and receive powers, with an upper bound of 60 dBm (decibels relative to mW, such that 60 dBm is 1 kW) of load signal power and a lower bound of −180 dBm (1 zW) of load signal power. The range of load signal frequencies for these inventions is contemplated to encompass common RF, microwave, and millimeter-wave frequencies, with an upper bound of 300 GHz and a lower bound of 30 MHz. The range of load signal bandwidths for these inventions is contemplated to vary between 0.1% and 100% of the load signal frequency. The individual capability of a particular embodiment of these inventions to accommodate load signals is not expected to encompass the entire ranges of load signal characteristics provided. Load signal bandwidth, for example, is typically in the range of 10% to 20% for most radar and communications applications, and is therefore the requirement for any phase shift circuit technology or architecture that is developed for use in those applications.

FIG. 1A is a schematic diagram representing a phase shift load 100 that imposes a phase shift on an electrical signal that is exposed to it's load signal input 2. An equivalent ground 1 for the load signal is referenced to the amplitude characteristic of the load signal, and is relative to the alternating current, RF, microwave, or millimeter-wave load signal. This is not necessarily the same reference as is used the direct current ground commonly used in electrical control circuits. Equivalent ground 1 might represent a virtual (i.e. non-physical) ground, which is a common circuit design feature. Load signal input 2 comprises one or more electrical paths or high frequency transmission lines that connects to the circuit of a phase shift element. The load signal input may or may not have an electrical phase length or other associated circuit characteristics. The component or circuit responsible for imposing the phase shift is a phase shift loading element 3. This phase shift loading element represents a variety of components and circuit configurations that provide a phase shift when implemented in the circuit architecture described by FIG. 1A. The arrow denotes one ore more electrically controlled circuit elements 4 that are controlled to change states in a digital or analog fashion. Each phase shift loading element is connected to equivalent ground 1 by one or more electrical paths or high frequency transmission lines by a shunt to ground 5.

The elements shown in FIG. 1A together form a "generic" symbol 100 (as shown in later figures) that can comprise various combinations of circuit elements that can perform an electrical loading function. Some of these circuit element arrangements are shown in FIGS. 1B, 1C, 1D, 1E, and 1F, each of which is an example of an arrangement of circuit elements that can perform the electrical function inferred by use of the symbol of FIG. 1A throughout this patent document. In all cases, the common electrical circuit characteristics of resistance, along with natural variance of material and electrical properties with frequency, manufacturing techniques, operating conditions, environmental exposure, and degradation are all contemplated as real and present, but these details are ignored for purposes of circuit illustration.

Figure 1B:
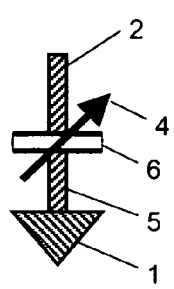
FIGS. 1B, 1C, 1D, 1E, and 1F are each a functional circuit diagram of circuit elements that can perform the electrical function inferred by use of the symbol of FIG. 1A.

FIG. 1B is a schematic diagram of a phase shift load that employs an electrically controlled varactor 6 as the phase shift loading element. This phase shift load represents either a digital phase shift technology or an analog phase shift technology, depending on the varactor technology and control circuit used. The use of an arrow superimposed on a conventional diagram of a capacitor component is a common symbol for a variable capacitance. In this diagram, the varactor object represents an electrically controlled variable capacitor, variable inductor, or electrically connected combination of variable capacitors and inductors. The circuit diagram for this phase shift load is otherwise identical as that shown in FIG. 1A.

FIGS. 1C, 1D, 1E, and 1F are each schematic diagrams of other possible circuit configurations of the symbol generically shown in FIG. 1A. Each employs switchable objects, such as switchable objects 7, 27, 107, 207, 307 for tuning, which means that all of these phase shift loads are digital technologies and/or circuit architectures. The switchable objects may be implemented as separate components in the circuit; alternatively, the switchable nature of a phase shift load may be an intrinsic electrical control property. Examples of components are solid-state diode or transistor switches, relays, trip switches, and other multi-state switching devices. Other examples include MEMS switching devices, which may be metallic-contact devices or capacitive contact devices, as well as the conventional electromechanical devices used in the RF, microwave, and millimeter-wave industries. Examples of switching control properties include devices such as two-state MEMS variable capacitors, and solid-state varactor diodes that are in an "off" state if a control signal is insufficient to enable varactor operation. Components with switchable control properties imply two or more states of operation.

Figure 1C:
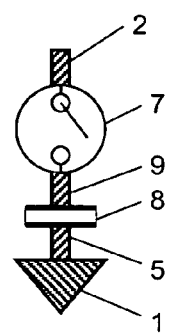

FIG. 1C illustrates one possible circuit configuration for a phase shift load in the form of a switchable reactance load. The circuit incorporates a switching object 7 connected by an electrical path or transmission line 9 to a first reactive component 8 of a fixed value. Switching object 7 can be any type of suitable switch including a mechanical device or one or more electrical components having a control property that connects electrical paths to reactive components. The absence of the variable arrow for the reactive component in FIG. 1C in contrast to its use in FIG. 11B denotes that the component or circuit element is a fixed value rather than a tunable value. The digital nature of this phase shift load circuit is due to the switching in or out of the phase influence of this reactive component.

Figure 1F:
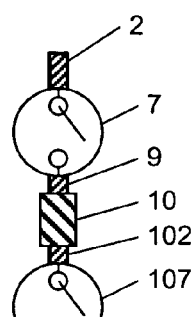
Figure 1D:
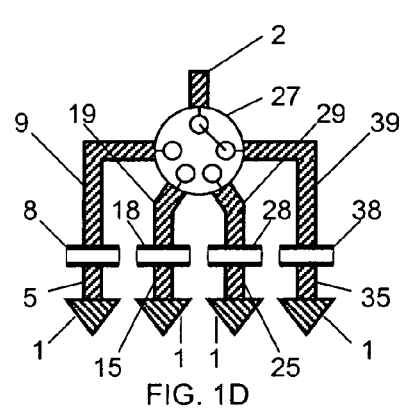

FIG. 1D illustrates one possible circuit configuration for a phase shift load in the form of multiple switchable reactive loads. As with FIG. 1C, this circuit incorporates a multiple throw switching object 27. As with switching object 7, switching object 27 can be any type of suitable switch including a mechanical device or one or more electrical components having a control property that connects electrical paths to reactive components. Switching object 27 can connect load signal input 2 to any one of electrical paths 9, 19, 29 or 39, which connect to respective reactive components 8, 18, 28 and 38, which connect to respective connections 5, 15, 25 and 35 to ground. In practice, this four-state digital phase shift load circuit architecture could be a three-state device, a five-state device, or have any integer number of states representing different switched reactance loads or combinations of switched reactance loads to impose phase shifts on the load signal.

Figure 1E:
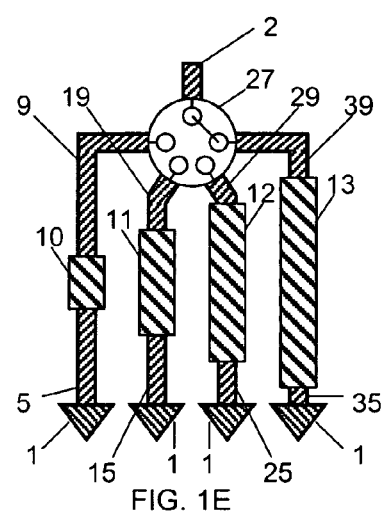

FIG. 1E illustrates another circuit configuration for a phase shift load including multiple switchable electrical loads on an input signal. This circuit configuration is similar to that of FIG. 1D, except that more complex circuit elements are employed instead of simple reactive components. Instead of switched reactive components, a first fixed phase delay RLC network or transmission line 10, a second fixed phase delay RLC network or transmission line 11, a third fixed phase delay RLC network or transmission line 12, and a fourth fixed phase delay RLC network or transmission line 13 are switched in and out of the loading circuit in order to impose a phase shift on the load signal at the input. Although only four switch states are shown in the figure, it is contemplated that any number of switch states could be used.

The circuit architecture of FIGS. 1D and 1E can be considered to be parallel loading circuits, in that each of the multiple phase shift loads are configured to be in a parallel configuration between the load signal input switching device and the relative ground in all cases. The circuit architecture of FIG. 1F, conversely, is considered a series loading circuit, in that multiple phase shift loads are configured to be positioned in series with their switching components or control properties along the same electrical path or transmission line. The manner of operation of a series phase shift loading element first considers the state of the first switching component 7 or control property. If the switch is open, then the phase shift imposed upon the load signal is considered to be a first value, where this first value is typically considered to be associated with the relative phase shift of zero.

If the first switch 7 is closed, the signal at load signal input 2 is connected via transmission line 9 to a first fixed phase delay RLC network or transmission line 10 which imposes a phase delay on the signal which is now connected to a second input electrical path or transmission line 102 to the second series switching component or control property 107. If this second switch is open, then the phase shift imposed upon the load signal is the second value, where this second value is typically considered to be associated with the smallest non-zero relative phase shift of the digital phase shift load. If this second switch is closed, then the second output electrical path 109 connects a second fixed phase delay RLC network or transmission line 110, which imposes a phase delay on the signal which is now connected to a third input electrical path or transmission line 202 to the third series switching component or control property 207. Each switch in series is toggled in order to impose an additional phase delay load upon the load signal, where the third output electrical path 209 connects to the third fixed phase delay RLC network or transmission line 210 and on to the fourth input electrical path or transmission line 302 and the fourth series switching component or control property 307.

In this example, the fourth series switching component or control property toggles electrical access to the fourth output electrical path 309 and the fourth fixed phase delay RLC network or transmission line 310, which is finally connected to relative ground. Even though for illustrative purposes a series arrangement of four switches and associated components is shown, it is contemplated that this architecture can be implemented to include any number of switches and associated circuitry. It is also contemplated that individual fixed reactance can be used in place of the RLC network or transmission line illustrated, with the circuit diagram for such an variant implementation easy to envision for those skilled in the art.

Figure 2A:
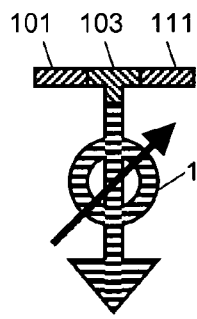
FIGS. 2A, 2B, and 2C are circuit diagrams for loaded-line phase shift elements as well as RLC phase shift elements. Each employs the symbol of FIG. 1A in order to simplify the description of many similar circuits with the same electrical function.
Figure 2B:
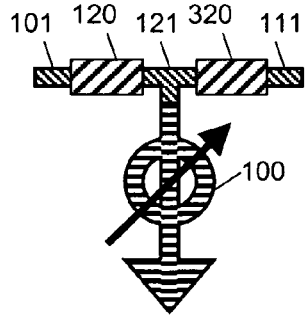
Figure 2C:
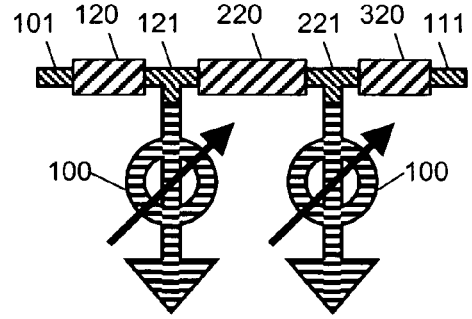

FIGS. 2A, 2B, and 2C are circuit diagrams for loaded-line phase shift elements as well as RLC phase shift elements, such as those shown in the architectures of FIGS. 1E and 1F. Each of these diagrams employs the symbol described in FIG. 1A as a generic phase shift load in order to simplify the description of many similar circuits with equivalent electrical functions. The architectures shown in FIGS. 2A, 2B and 2C can include both analog and digital phase shift elements as the analog phase shift loads represented by certain implementations of FIG. 1B as well as the digital phase shift loads represented by other implementations of FIG. 1B and the digital phase shift loads of FIGS. 1C, 1D, 1E, and 1F are incorporated in the symbolic use of the generic phase shift load of FIG. 1A.

FIG. 2A is a circuit diagram for the most basic phase shift element that uses the phase shift loads represented by FIG. 1A. The phase shift element has a load signal transmission input 101 connected to a phase shift load intersection 103 and then to a load signal transmission output 111. The phase shift load 100, which represents the generic phase shift load circuit element of FIG. 1A, is electrically connected to the phase shift load intersection. As a load signal travels from the load signal transmission input 101 to the load signal transmission output 111, the presence of the phase shift load imposes a phase shift upon the load signal. The load signal that appears at the output will have an electrically controlled phase shift in comparison to a relative zero phase shift state. This range of imposed phase shifts will likely include one possible state of zero relative phase shift as previously defined.

In the circuit diagram of FIG. 2B, a set of RLC networks and/or transmission lines are added for a more complete circuit design architecture. The load signal transmission input 101 is first connected to an input RLC network or transmission line 120, then to a first phase shift load intersection 121, then to an output RLC network or transmission line 320. In a similar manner as with the circuit of FIG. 2A, a phase shift load is electrically connected to the first phase shift load intersection, and performs the phase shift function exactly as above, but now with the benefit of a matched circuit or transmission line input and output in order to simplify the implementation of the phase shift element in a larger phase shifter circuit product.

FIG. 2C illustrates a staged example of the circuit architecture of FIG. 2B, wherein two phase shift elements are cascaded together. The first phase shift load intersection is electrically connected in series to a second RLC network or transmission line 220, then to a second phase shift load intersection 221, then to the output RLC network or transmission line 320 and output 111 as previously described for the architecture of FIG. 2B. This circuit architecture enables a higher level of circuit phase shift tuning flexibility and electrical performance, as the second RLC network or transmission line provides the capability of creating a matched impedance for both phase shift loads relative to the input and output of the circuit. As with the other series and parallel circuit examples, the two stages in the circuit of FIG. 2C are provided for illustrative purposes, and it is contemplated that a three-stage, four-stage, or any integer number-stage implementation of the circuit architecture of FIG. 2C can be realized.

Figure 3A:
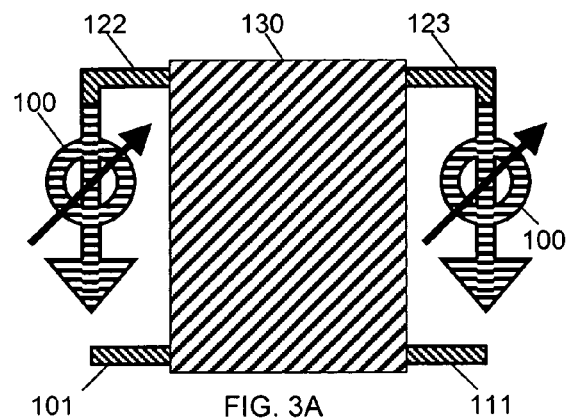
FIGS. 3A, 3B, and 3C illustrate circuit diagrams for reflect-line phase shift elements. Each of these diagrams employs the symbol of FIG. 1A in order to simplify the description of many similar circuits with the same electrical function.
Figure 3B:
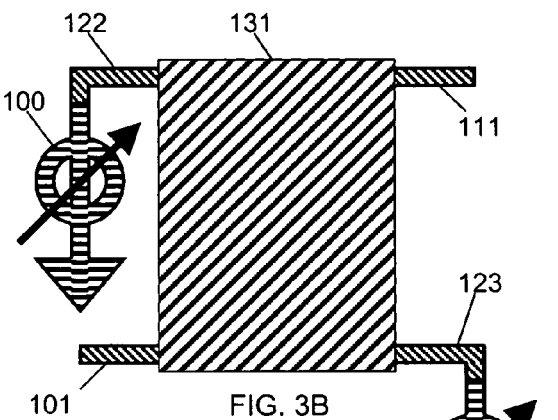
Figure 3C:
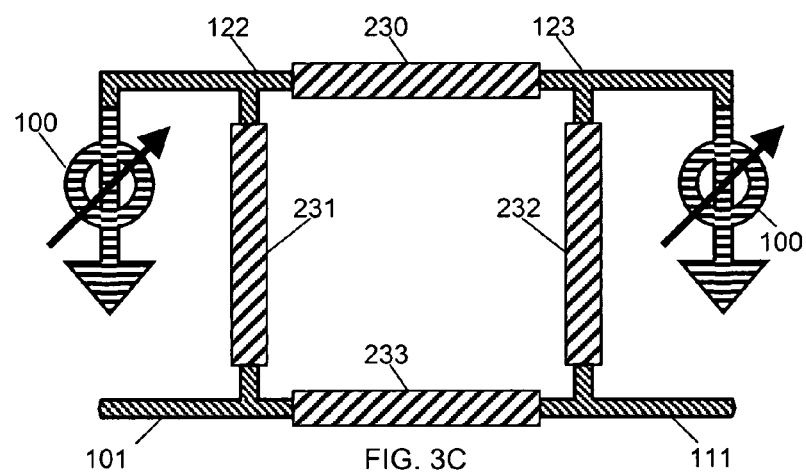

FIGS. 3A, 3B, and 3C illustrate circuit diagrams for reflect-line phase shift elements. As with the previously described circuits, each of these diagrams employs the generic symbol 100 of FIG. 1A in order to simplify the description of many similar circuits with the same electrical function. It is contemplated that in many embodiments of these inventions, the generic phase shift loads in FIGS. 3A, 3B, and 3C would be matched to each other, but it is recognized that some embodiments could take advantage of mismatched phase shift loads in order to provide additional system-level performance advantages.

In FIG. 3A, the load signal transmission input feeds the load signal into the first of four connections to a coupler circuit 130. A coupler circuit is designed to take an input load signal from the first connection and divide the electrical characteristics of that input load signal into two partial input load signals. The first partial input load signal is directed to the second coupler circuit connection 122, and the second partial input load signal is directed to the third coupler circuit connection 123. A coupler circuit is also designed to take input load signals from the second and third connections, and combine them into a load signal transmission output sent to the fourth connection to the coupler circuit. The operation of this circuit is best explained in terms of the load signal, which starts at the input, and is split into two parts. Each of the two parts is directed to two temporary outputs and into phase shift load circuits. These two partial signals are then phase shifted by the phase shift loads and reflected back to the coupler circuit. The two reflected, phase shifted partial signals now see the second and third coupler connections as temporary inputs rather than temporary outputs, and re-enter the coupler circuit. The coupler circuit recombines the two phase shifted partial signals into one complete phase shifted load signal, which is finally sent to the load signal transmission output.

FIG. 3B illustrates a commonly-employed variant architecture of the reflect-line phase shift element described by FIG. 3A. In this architecture, the location of the third and fourth coupling circuit connections are exchanged, but the electrical function of all elements is otherwise identical. In the assessment of planar circuit configurations, however, it is important to recognize the coupling circuit design, so that the electrical functions of the inputs and outputs are not confused between one coupling circuit architecture and this second architecture using a reversed coupling circuit 131. It should be noted that there is no engineering term to differentiate standard and reversed coupling circuit architectures, as many coupling circuit technologies are capable of being used for either architecture with careful design.

FIG. 3C illustrates a detailed example of a reflect-line phase shift element using a coupling circuit having the same architecture as shown in FIG. 3A. The generic circuit element of a standard coupling circuit is now shown in greater detail so that the electrical functions of each circuit element inside the coupler can be made clear. All input and output connections to the coupling circuit are the same as described in FIG. 3A, as are the phase shift loads. The coupling circuit is now shown as four separate coupling circuit elements, which each represent RLC circuits, transmission lines, or combinations of RLC circuits or transmission lines with designed passive electrical properties. Directly between the load signal transmission input and the load signal transmission output is a first coupling circuit element 233, which is designed in such a way as to prevent the input load signal from directly passing through to the coupling circuit output, due to a particular combination with the circuitous path around the other direction of coupler circuit signal travel. This circuitous path is the second coupling circuit element 231, followed by the third coupling circuit element 230, and finally the fourth coupling circuit element 232. The second coupling circuit element and third coupling circuit element are designed such that a load signal at the load signal transmission input is split into two parts, where the first part is sent to the second coupling circuit connection and the second part is sent to the third coupling circuit connection. The third coupling circuit element is further designed such that an input from the second coupling circuit connection is prevented from reaching the third coupling circuit connection, and vice versa. In a mirrored fashion, the fourth coupling circuit element and third coupling circuit element are designed such that a load signal at the load signal transmission output is split into two parts, where the first part is sent to the third coupling circuit connection and the second part is sent to the second coupling circuit connection. The end result is that each partial signal is forced to interact with the phase shift loads in order to see the reflection point at ground, which then forces the load signal back through the phase shift load and back into the coupling circuit. Only when the phase shifted partial signals return as new inputs are they allowed to recombine, and the mirrored fashion of the circuit design means that they can only recombine as they travel towards the load signal transmission output rather than the original load signal transmission input.

A common example of a coupling circuit illustrated by FIG. 3C is a branch-line coupler. In such an example, the four coupling circuit elements are implemented as high-frequency transmission lines with a common characteristic impedance denoted by the term "$Z_0$." In this common coupling circuit configuration, the four coupling circuit elements have characteristic impedances which can vary based on the characteristic impedances of their connections, and by their length, which in all four cases is one-fourth of the wavelength of the center frequency of the load signal. In a "3 dB branch line coupler", the input load signal is split into two partial signals that are each one half of the original signal (one half of a signal is three decibels less than the original). In a 3 dB branch-line coupler, the characteristic impedances of the second and fourth coupling circuit elements are $Z_0$, the same as the connections, and the characteristic impedances of the first and third coupling circuit elements are $Z_0$ divided by the square root of two. This particular configuration of coupling circuit elements provides an even distribution of load signal power to the two phase shift loads, and provides for a balanced load signal recombination to be sent to the output of the phase shift element.

Figure 4A:
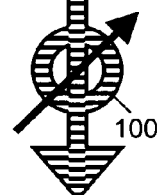
FIGS. 4A and 4B illustrate circuit diagrams for switched-line phase shift elements having four state options. The two diagrams illustrate two different states of the same device.
Figure 4A:
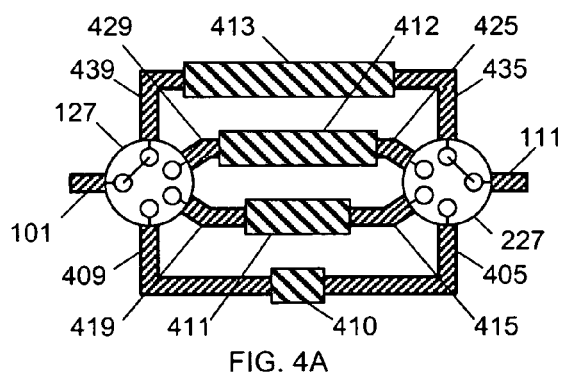
Figure 4B:
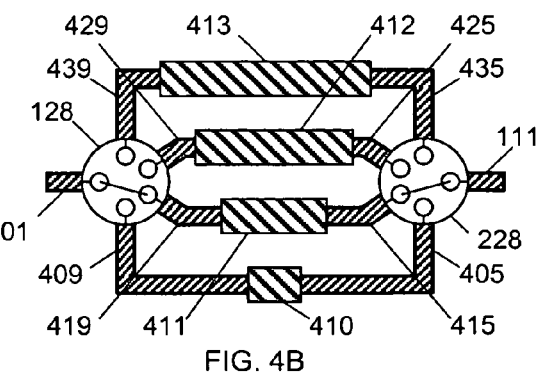

FIGS. 4A and 4B illustrate circuit diagrams for switched-line phase shift elements having multiple line elements, where each line element represents an RLC circuit, transmission line, or combination of RLC circuits and transmission lines. Each line element can be switched in as a separate state option, where FIGS. 4A and 4B illustrate two different states of the same four-state example. Each of the four line elements has a different set of electrical properties, such that a load signal passing through one line element would experience one phase, and passing through a different line element would experience a different phase. In practice, these four-state digital switched-line phase shift elements could be three-state devices, five-state devices, or have any integer number of states representing different switched line elements to impose different phase shifts on the load signal.

In FIG. 4A, the load signal transmission input is connected to an input multi-state switching device or control property 127 which selects one of four options for the load signal. The first option is a first line element input 409, which is connected to a first line element 410. This first line input has particular electrical characteristics, including a first phase delay. The first line element is then connected to a first line element output 405 and to an output multi-state switching device or control property 227. The input and output switching devices are controlled in such a way that if the first line element input is selected, then the first line element output can also be selected so that the load signal is directed through the first line element and experiences the first phase delay, accordingly. In a parallel fashion, the second option is a second line element input 419, which is connected to a second line element 411 with a second phase delay electrical characteristic. The second line element is then connected to a second line element output 415 and to the output multi-state switching device or control property. The third option is a third line element input 429 connected to a third line element 412 having a third phase delay, which is then connected to a third line element output 425. The fourth option is a fourth line element 439 connected to a fourth line element 413 having a fourth phase delay, which is then connected to a fourth line element output 435. The input and output switching devices are controlled such that any one of the line elements can be selected, such that the input load signal travels through the line element, experiencing its phase delay, and then directed to the load signal transmission output. Each of the load signals has a different phase delay, which is represented schematically by the different lengths of the line element objects in FIG. 3C. In this particular example, the fourth line element is selected, implying that the largest phase delay state out of the four options will be experienced by the load signal.

FIG. 4B illustrates the same digital switched-line phase delay element as that shown in FIG. 4A, except that the switching devices or control properties are set for selecting a different line element. The alternate input multi-state switching device or control property 128 is set to select the second line element, as is the alternate output multi-state switching device or control property 228. In this particular example, the second line element is selected, implying that the second smallest phase delay state out of the four options will be experienced by the load signal.

Figure 5:
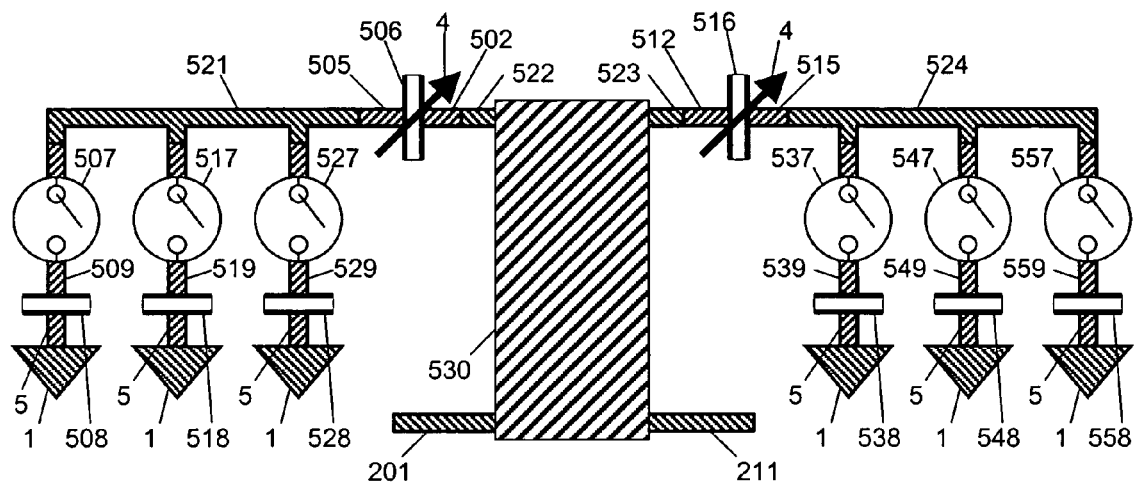
FIG. 5 is circuit diagram of an embodiment of the inventions having both analog phase shift elements and digital phase shift elements. It includes a reflect-line digital element with an integral varactor-tuned analog element.
Figure 6:
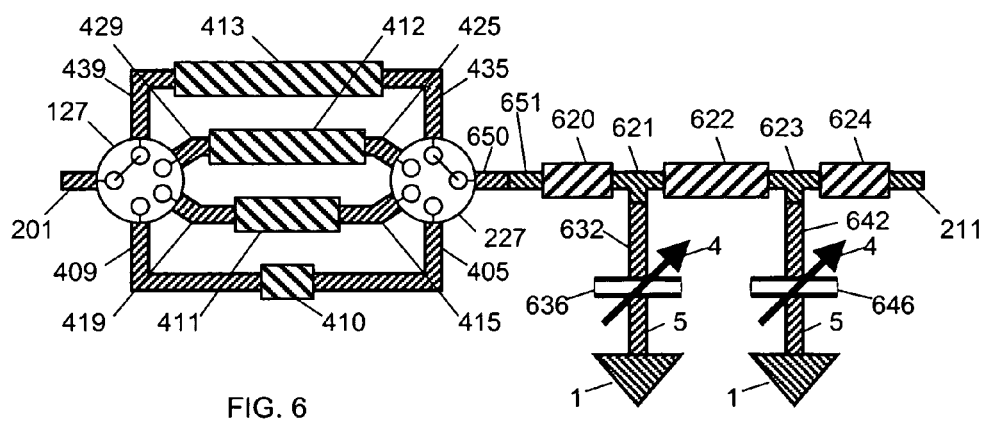
FIG. 6 is circuit diagram of another embodiment of the inventions having both analog phase shift elements and digital phase shift elements. It includes a switched-line digital element in series with a loaded-line analog phase shift element.

FIGS. 5 and 6 illustrates circuit diagrams of two embodiment of the phase shifter inventions, each of which having both electrically controlled analog phase shift elements and digital phase shift elements. Each of these two embodiments illustrate the phase shift circuitry that interacts with the load signal, without describing the electrical control circuitry required to operate these phase shifters. The details of control signal circuit design are not considered sufficiently novel to describe herein.

FIG. 5 illustrates an electrically controlled hybrid digital and analog phase shifter that incorporates an analog reflect-line phase shift element similar to that described by FIG. 3A, and digital cascaded switched-reactance phase shift elements similar to that described by a combination of FIGS. 1C and 2C. In this phase shifter, a load signal phase shifter input 201 and a load signal phase shifter output 211 are connected to a phase shifter coupler circuit 530. In a similar manner as the description for FIG. 3A, a load signal enters at the load signal phase shifter input and is split into two partial load signals, one sent to the second phase shifter coupler connection 522 and the other sent to the third phase shifter coupler connection 523. Each partial load signal experiences a phase shift, is reflected by the load signal ground, and then experiences another phase shift prior to re-entering the phase shifter coupler circuit. The two phase shifted partial load signals are then recombined and are directed to the load signal phase shifter output. The combination of digital and analog phase shift elements, therefore, are associated with the design of the phase shift loads.

The phase shift load associated with the second phase shifter coupler connection is first connected to the analog phase shift element, represented by a first phase shifter varactor input 502 connecting to a first phase shifter analog varactor 506 that is a variable reactance. The first partial load signal experiences an analog phase shift as it passes through to the first phase shifter varactor output 505 and on to the first digital phase shift load input 521. Here the load signal is exposed to three separate switchable phase shift loads connected to ground. A first phase load switching device 507 is connected to a first reactance 508 by a first reactance connection 509. When the first phase load switching device is closed, the first partial load signal passes through to the reactance, experiences a phase shift, and is then reflected by the load signal ground. It experiences the reactance phase shift again, passing back through the switching device, back through the analog varactor, and back into the phase shifter coupler. In a similar fashion, the second and third digital switched phase shift loads can also be switched in to impose a phase shift to the load signal. The second phase load switching device 517 is connected to a second reactance 518 by a second reactance connection 519, and the third phase load switching device 527 is connected to a third reactance 528 by a third reactance connection 529. It is contemplated that in one configuration, none or one of the three switchable reactances can be selected at any one time, which would represent a four-state digital phase shift element. It is also contemplated that in a second configuration, any of the three switchable reactances can be selected at any one time independently from each other, which would represent an eight-state digital phase shift element, which could also be called a 3-bit digital phase shift element as described previously.

The operation of the phase shift load associated with the third phase shifter coupler connection is equivalent to that just described, except that it operates on the second partial load signal second phase shifter varactor input 512 connects to a second phase shifter analog varactor 516 that is a variable reactance. The second partial load signal experiences an analog phase shift as it passes through to the second phase shifter varactor output 515 and on to the second digital phase shift load input 524. As with the first phase shift load described, the second load signal is then exposed to the digital phase shift element. The fourth phase load switching device 537 is connected to a fourth reactance 538 by a fourth reactance connection 539. The fifth phase load switching device 547 is connected to a fifth reactance 548 by a fifth reactance connection 549, and the sixth phase load switching device 557 is connected to a sixth reactance 558 by a sixth reactance connection 559. It is contemplated that in one configuration, the first phase shift load is the same as the second phase shift load, so that the phase shift experienced by the two partial load signals are identical. It is also contemplated than in another configuration, the two phase shifts imposed on the two partial load signals are different. This may be performed in order to provide additional system-level advantages in load signal phase shift, or to compensate for variances in the performance of one or more internal circuits or components relative to those in the other phase shift load.

FIG. 6 shows an electrically controlled hybrid digital and analog phase shifter that is a switched-line digital phase shift element in series with a loaded-line analog phase shift element. The switched-line digital phase shift element is similar to that illustrated in FIG. 4A, and the loaded-line analog phase shift element is similar to a combination of illustrations FIGS. 1B and 2C. The load signal phase shifter input is connected to an input multi-state switching device or control property which selects one of four options. Referring to the detailed description of FIG. 4A, it is evident that the longest of four phase shift state is selected in this example. The load signal then progresses through the output multi-state switching device or control property to the digital phase shift element output 650. This concludes the digital portion of the hybrid phase shifter design in this embodiment.

The digital phase shift element output is connected to the analog phase shift element input 651 and an analog input RLC network or transmission line 620. This has particular electrical characteristics that prepare the load signal for the phase shift loads that follow the first analog phase shift load intersection 621 and can simplify the implementation of the analog phase shift element in the hybrid phase shifter circuit. It is contemplated, however, that in one configuration, the analog input RLC network or transmission line is very short, negligible, or otherwise has equivalent electrical characteristics as the output of the digital phase shifter element immediately preceding. In a similar manner as with the circuit of FIG. 2A, a phase shift load is electrically connected to the first analog phase shift load intersection, where this phase shift load is comprised of a tunable varactor element comparable to that illustrated in FIG. 1B. The first analog phase shift load element input 632 connects the first analog phase shift load intersection with the first analog phase shift varactor 636. This varactor is tunable and connected to ground as described in the detailed description of FIG. 1A. As with FIG. 2B, the first analog phase shift load element is cascaded by means of a analog element second RLC network or transmission line 622, then to a second analog phase shift load intersection 623, where the second load element is connected. The second analog phase shift load element input 642 connects the second analog phase shift load intersection with the second analog phase shift varactor 646 in an equivalent manner and operation as previously described. The output analog RLC network or transmission line 624 connects the second analog phase shift load intersection with the load signal phase shifter output.

As with the other circuit examples, the four digital options in the digital phase shift element portion of FIG. 6 and the two stages in the analog phase shift element portion of FIG. 6 are provided as an example of one of the many configurations that can be realized in this hybrid phase shifter circuit architecture. It is contemplated that other integer numbers of stages in the digital or analog elements of this phase shifter can be realized by those skilled in the art.

What is claimed is:

1. A hybrid phase shifter comprising:
    one or more electronically controlled digital phase shift elements, and
    one or more electronically controlled analog phase shift elements,
    one or more multi-state MEMS actuators constructed and arranged to switch one or more digital phase shift elements, wherein:
one or more phase shift elements having an RLC architecture comprising one or more switchable or digitally variable resistors, inductors, or capacitors,
each analog phase shift element incorporates one or more varactors,
changes in phase shift occur when the reactance of these varactors is changed, and
a load signal that enters the hybrid phase shifter is phase shifted by both the digital phase shift elements and the analog phase shift elements, and the amount of phase shift provided by the digital and analog phase shift elements can be electronically controlled to vary between a baseline degree of phase shift and a maximum degree of phase shift.

2. The hybrid phase shifter of claim 1, wherein:
the digital phase shift element has a switched-line architecture, comprising multiple phase delay lines and two or more switching devices used to switch between the delay lines.

3. The hybrid phase shifter of claim 1, wherein:
the digital phase shift element has a reflect-line architecture comprising one or more couplers connected to multiple phase delay lines and switching devices used to switch between the delay lines.

4. The hybrid phase shifter of claim 1, wherein:
the digital phase shift element has a loaded-line architecture comprising one or more switchable phase delay loads connected to a signal path of the phase shifter.

5. The hybrid phase shifter of claim 1, wherein:
the digital phase shift element has the RLC architecture.

6. The hybrid phase shifter of claim 1, wherein:
the digital phase shift element has an architecture comprising a combination of digital phase shifter architectures.

7. The hybrid phase shifter of claim 6, wherein:
the digital phase shift element has a switched-line architecture, comprising multiple phase delay lines and two or more switching devices used to switch between the delay lines.

8. The hybrid phase shifter of claim 6, wherein:
the digital phase shift element has a reflect-line architecture comprising one or more couplers connected to multiple phase delay lines and switching devices used to switch between the delay lines.

9. The hybrid phase shifter of claim 6, wherein:
the digital phase shift element has a loaded-line architecture comprising one or more switchable phase delay loads connected to the phase shifter signal path.

10. The hybrid phase shifter of claim 6, wherein:
the digital phase shift element has the RLC architecture.

11. The hybrid phase shifter of claim 1, wherein:
the digital phase shift element incorporates diodes or transistors as switching components.

12. The hybrid phase shifter of claim 1, wherein:
the digital phase shift element incorporates varactors comprising diodes or transistor circuits.

13. The hybrid phase shifter of claim 1, wherein:
the digital phase shift element incorporates varactors made of ferroelectric, paraelectric, or variable nonlinear dielectric material.

14. The hybrid phase shifter of claim 1, wherein:
the analog phase shift element has a reflect-line architecture comprising one or more couplers connected to continuously-tunable phase delay loads.

15. The hybrid phase shifter of claim 1, wherein:
the analog phase shift element has a loaded-line architecture, consisting of one or more continuously-tunable phase delay loads connected to the phase shifter signal path.

16. The hybrid phase shifter of claim 1, wherein:
the analog phase shift element has an RLC architecture comprising one or more fixed resistors with continuously-tunable inductors and/or capacitors to provide phase delay.

17. The hybrid phase shifter of claim 1, wherein:
the analog phase shift element incorporates varactors comprising diodes or transistor circuits.

18. The hybrid phase shifter of claim 1, wherein:
the analog phase shift element incorporates varactors comprising ferroelectric, paraelectric, or variable non-linear dielectric material.

19. The hybrid phase shifter of claim 1, wherein:
the analog phase shift element incorporates varactors made of MEMS devices.

20. The hybrid phase shifter of claim 1, wherein:
the analog phase shift element is tuned to compensate for fabrication, assembly, or packaging variations that occur in the manufacturing of the circuit in order to provide an accurate overall phase shift.

21. The hybrid phase shifter of claim 20, wherein:
the device provides autonomous methods of electrical control for continuous compensation of phase error due to phase shift element performance changes.

22. The hybrid phase shifter of claim 1, wherein:
the analog phase shift element is tuned to compensate for varying environmental, electrical, or system operating conditions in order to provide an accurate overall phase shift.

23. The hybrid phase shifter of claim 22, wherein:
the device provides autonomous methods of electrical control for continuous compensation of phase error due to environmental, electrical, or system operating conditions.

24. The hybrid phase shifter of claim 1, wherein:
the analog phase shift element is tuned to compensate for varying and/or degrading electrical and/or mechanical characteristics of circuit components over time.

25. The hybrid phase shifter of claim 1, wherein:
the analog phase shift element is controlled by a digital electrical signal.

26. The hybrid phase shifter of claim 1, wherein:
the device is controlled by a combination of analog and digital signals.

* * * * *